US007667385B2

(12) United States Patent
Lee et al.

(10) Patent No.: US 7,667,385 B2
(45) Date of Patent: Feb. 23, 2010

(54) ORGANIC THIN FILM TRANSISTOR AND ORGANIC ELECTROLUMINESCENT DEVICE USING THE SAME

(75) Inventors: Hun-Jung Lee, Suwon-si (KR); Jae-Bon Koo, Suwon-si (KR)

(73) Assignee: Samsung Mobile Display Co., Ltd., Yongin,Gyunggi-do (KR)

( * ) Notice: Subject to any disclaimer, the term of this patent is extended or adjusted under 35 U.S.C. 154(b) by 546 days.

(21) Appl. No.: 11/249,284

(22) Filed: Oct. 13, 2005

(65) Prior Publication Data

US 2006/0091785 A1 May 4, 2006

(30) Foreign Application Priority Data

Oct. 14, 2004 (KR) ...................... 10-2004-0082091

(51) Int. Cl.
*H01J 1/62* (2006.01)

(52) U.S. Cl. ....................... 313/504; 313/498; 313/499; 313/509

(58) Field of Classification Search ....................... None
See application file for complete search history.

(56) References Cited

U.S. PATENT DOCUMENTS

2004/0004215 A1 * 1/2004 Iechi et al. .................... 257/40
2004/0191951 A1 * 9/2004 Shim et al. .................... 438/99
2006/0086937 A1 * 4/2006 Fujii et al. .................... 257/72

* cited by examiner

*Primary Examiner*—Joseph L. Williams
*Assistant Examiner*—Fatima N Farokhrooz
(74) *Attorney, Agent, or Firm*—Knobbe Martens Olson & Bear LLP

(57) ABSTRACT

An organic thin film transistor (OTFT) and an organic electroluminescent display (OLED) device are disclosed. The OTFT includes a drain electrode, functioning as a pixel electrode (anode electrode) of an organic emission element, such that the manufacturing process of an OLED device is simplified. In one embodiment, the OLED device includes: i) a substrate comprising an emission region and a non-emission region, ii) an organic thin film transistor, which comprises, a gate electrode, source and drain electrodes respectively overlapping both side portions of the gate electrode, and a semiconductor layer, and is disposed in the non-emission region, and iii) an organic light emitting element comprising a lower electrode, an organic layer, and an upper electrode. In one embodiment, one of the source electrode and drain electrode of the OTFT extends to the emission region, the semiconductor layer has an opening exposing a portion of the extending electrode, and the exposed portion of the extending electrode acts as a lower electrode (pixel or anode electrode) of the organic light emitting element.

24 Claims, 4 Drawing Sheets

ORGANIC THIN FILM TRANSISTOR AND ORGANIC ELECTROLUMINESCENT DEVICE USING THE SAME

This application claims the benefit of Korean Patent Application No. 10-2004-0082091, filed on 14 Oct. 2004, in the Korean Intellectual Property Office, the disclosure of which is incorporated herein in its entirety by reference.

BACKGROUND OF THE INVENTION

1. Field of the Invention

The present invention relates to an organic electroluminescent display device, and more particularly, to an organic thin film transistor including a drain electrode used as a pixel electrode and an organic electroluminescent display device using the same.

2. Description of the Related Technology

Organic thin film transistors (OTFTs) have been recognized as next generation display devices and a great deal of research concerning OTFTs has been conducted. An OTFT includes a semiconductor layer formed of an organic compound instead of silicon. The organic compound can be a low molecular weight organic material or a polymer organic material. The low molecular weight organic material may include oligothiophene, pentacene, or the like. The polymer organic material may include polythiophene or the like.

FIG. 1 is a plan view of a pixel of a flexible organic electroluminescent display device 10 including a conventional OTFT.

Referring to FIG. 1, in the conventional flexible organic electroluminescent display device 10, a pixel is disposed in a pixel region 15 defined by a gate line 110, a data line 120, and a power line 130. The pixel disposed in the pixel region 15 includes a switching OTFT 140, a driving OTFT 160, a capacitor 150, and an organic emission element including a lower electrode 180 used as a pixel electrode. The pixel region 15 includes an emission region where light emission occurs and a non-emission region where light emission does not occur. The organic electroluminescent (EL) device, which emits light, is disposed in the emission region. The switching OTFT 140, the driving OTFT 160, and the capacitor 150 are disposed in the non-emission region.

The switching OTFT 140 includes a gate electrode 141 connected to the gate line 110, a semiconductor layer 170, and source and drain electrodes 143 and 145. The capacitor 150 includes a lower electrode 151 connected to the drain electrode 145 of the switching OTFT 140, and an upper electrode 155 that overlaps the lower electrode 151 and is connected to the power line 130.

The driving OTFT 160 includes a gate electrode 161 connected to the lower electrode 151 of the capacitor 150, the semiconductor layer 170, a source electrode 163 connected to the power line 130, and a drain electrode 165 connected to the lower electrode 180 through a viahole 167.

FIG. 2 is a sectional view taken along line II-II in FIG. 1. FIG. 2 illustrates only the organic emission element including the anode electrode 180, an organic layer 190 and a cathode electrode 195, the driving OTFT 160 used to drive the organic emission element, and the capacitor 150 of the pixel.

Referring to FIG. 2, the gate electrode 161, and the lower electrode 151 of the capacitor 150 are formed on a substrate 100. A gate insulator 101 covers the gate electrode 161, and the lower electrode 151 of the capacitor 150, and the substrate 100. The source and drain electrodes 163 and 165 and the upper electrode 155 of the capacitor 150 are formed on the gate insulator 101, and the semiconductor layer 170 is formed over the substrate 100.

The lower electrode 180 used as a pixel electrode, which will be interchangeably used to refer to an anode electrode, is formed on a protecting layer 103, and is connected to the drain electrode 165 through the viahole 167. An opening 185 formed in a pixel isolation layer 105 exposes a portion of the lower electrode 180. The organic layer 190 is formed on the lower electrode 180 inside the opening 185. Then, the upper electrode 195 used as a cathode electrode is formed over the substrate 100.

As mentioned above, when the conventional organic electroluminescent display device has a rear emission structure in which light emitted from an organic layer is emitted toward a substrate, a lower electrode used as an anode is a transmittance electrode and an upper electrode used as a cathode is a non-transmittance electrode. Furthermore, in order to allow light to transmit from the organic layer 190 through the substrate 100, the intermediate layers (103, 170, 101) are formed of a light-transparent material.

However, the manufacturing process of such a conventional organic EL device is complicated because many masking processes are required to form a gate electrode, source and drain electrodes, a viahole, an anode electrode, a pixel isolation layer, and the like.

SUMMARY OF CERTAIN INVENTIVE ASPECTS

One embodiment of the present invention provides i) a thin film transistor (TFT) including a drain electrode having a pixel electrode material such that a manufacturing process is simplified, and ii) an organic electroluminescent display device including the TFT.

In one embodiment, the TFT includes i) a substrate, ii) a gate electrode formed on the substrate, iii) a source electrode overlapping a first side portion of the gate electrode, iv) a drain electrode overlapping a second side portion of the gate electrode, v) a gate insulator formed between the source and drain electrodes and the gate electrode, and vi) a semiconductor layer that contacts the source and drain electrodes, has an opening exposing a portion of one of the source electrode and the drain electrode, and is formed over the substrate. In this embodiment, one of the source electrode and the drain electrode is formed of a transparent electrode material and the other is formed of a high work function electrode material with a higher work function than the semiconductor layer.

In one embodiment, the gate insulator may be formed of an organic insulating material and the semiconductor layer may be formed of an organic semiconducting material.

In one embodiment, the electrode selected from the source electrode and the drain electrode may include a transparent conducting layer formed of ITO or IZO, and the high work function electrode material is a metal material selected from the group consisting of Au, Pt, Pd, and MoW oxide, or an organic conducting material selected from PEDOT (Poly-3, 4-Ethylenedioxythiophene).

Another aspect of the present invention provides a flat display device. In one embodiment, the flat display device includes i) a substrate comprising an emission region and a non-emission region, ii) a first electrode formed on the substrate, iii) a second electrode overlapping a first side portion of the first electrode in the non-emission region, iv) a third electrode overlapping a second side portion of the first electrode in the non-emission region, v) an insulator formed between the second and third electrodes, and the first electrode, and vi) a semiconductor layer formed over the substrate. In this embodiment, one of the second electrode and the third electrode extends to the emission region, the semiconductor layer has an opening exposing a portion of the electrode extending to the emission region, and the portion of the electrode extending to the emission region exposed by the opening of the semiconductor layer acts as a pixel electrode.

Still another aspect of the present invention provides a flat display device. In one embodiment, the flat display device includes i) a substrate, ii) a gate line, a data line, and a power line arranged on the substrate, iii) a pixel region which has a non-emission region and an emission region, and is defined by the gate line, the data line, and the power line, iv) an organic thin film transistor which comprises: a gate electrode, source and drain electrodes, and a semiconductor layer, and is disposed in the non-emission region, and v) a display device comprising a pixel electrode arranged in the emission region. In this embodiment, the source and drain electrodes are formed of different materials, one of the source electrode and the drain electrode extends to the emission region of the pixel region, and a portion of the electrode extending to the emission region acts as a pixel electrode of the display device.

Still another aspect of the present invention provides an organic electroluminescent display device. In one embodiment, the display device includes i) a substrate comprising an emission region and a non-emission region, ii) an organic thin film transistor, which comprises: a gate electrode, source and drain electrodes, respectively, overlapping both side portions of the gate electrode, and a semiconductor layer, and is disposed in the non-emission region, and iii) an organic light emitting element comprising: a lower electrode, an organic layer, and an upper electrode. In this embodiment, one of the source electrode and drain electrode of the organic thin film transistor extends to the emission region, the semiconductor layer has an opening exposing a portion of the extending electrode, and the exposed portion of the extending electrode acts as a lower electrode of the organic light emitting element.

Yet another aspect of the present invention provides an organic electroluminescent display device. In one embodiment, the display device includes i) a substrate comprising an emission region and a non-emission region, ii) a gate electrode formed in the non-emission region of the substrate, iii) a first insulator formed over the substrate, iv) a source electrode overlapping a first side portion of the gate electrode formed on the first insulator in the non-emission region, v) a drain electrode overlapping a second side portion of the gate electrode formed on the first insulator in the non-emission region, a portion of the drain electrode to the emission region to form a lower electrode. The display device also includes vi) an organic semiconductor layer having an opening exposing a portion of the lower electrode, vii) a second insulator formed over the substrate exposing the portion of the exposed lower electrode, viii) an organic layer formed on the exposed portion of the lower electrode by the second insulator, and ix) an upper electrode formed over the substrate.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Embodiments of the present invention will now be described more fully with reference to the accompanying drawings, in which exemplary embodiments of the invention are shown.

Figure 1:
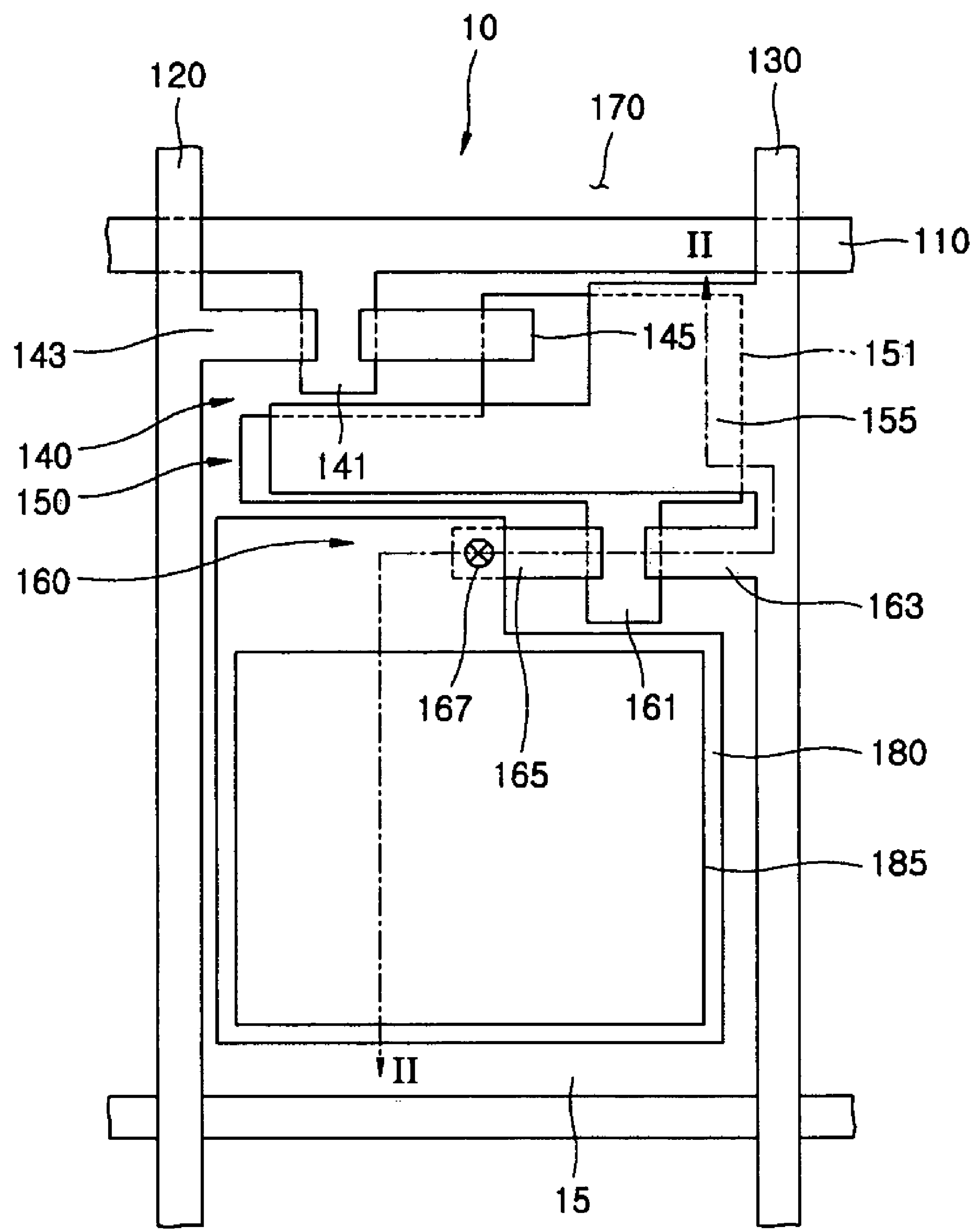
FIG. 1 is a plan view of a pixel of an organic electroluminescent display device including a conventional organic thin film transistor (OTFT).
Figure 2:
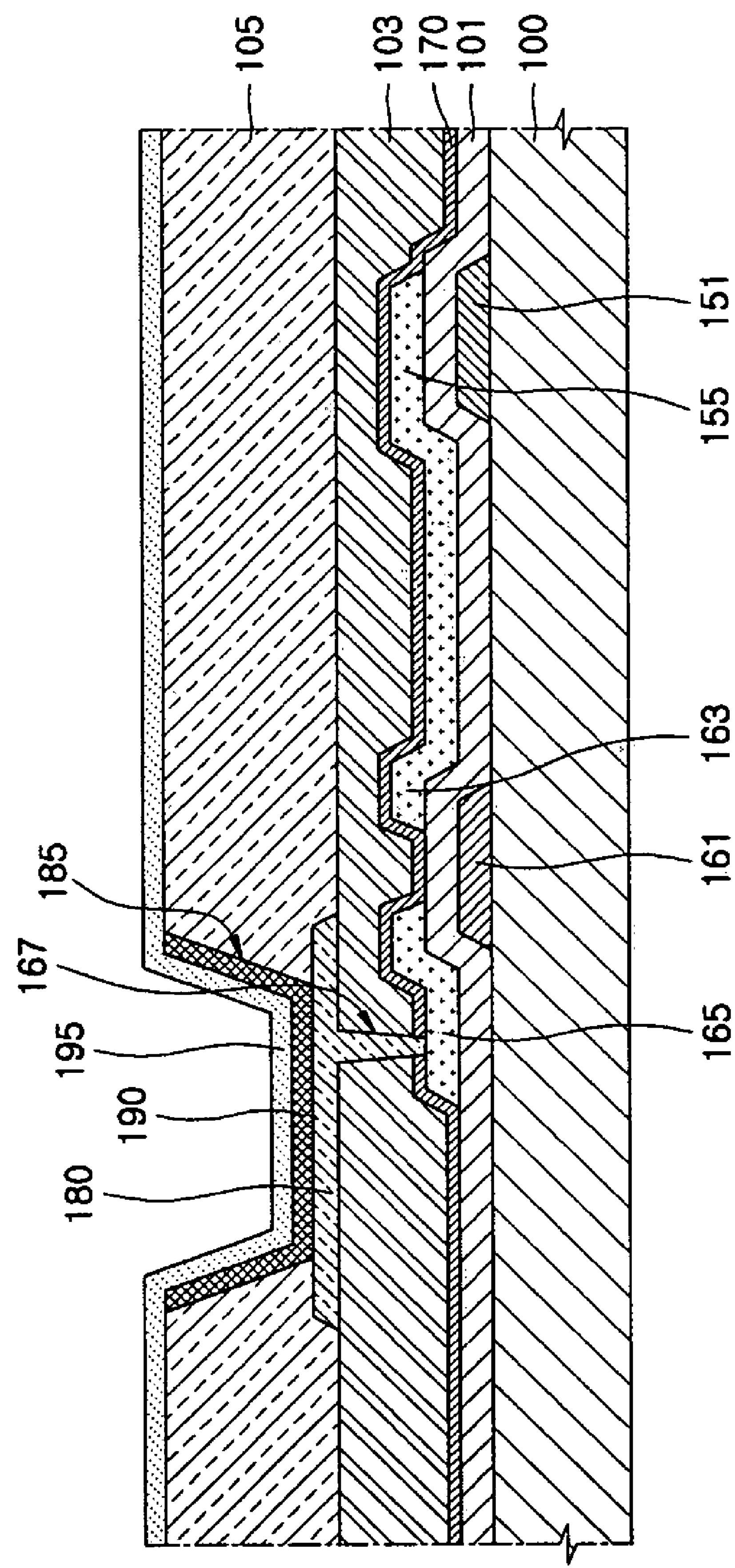
FIG. 2 is a sectional view taken along line II-II in FIG. 1.
Figure 3:
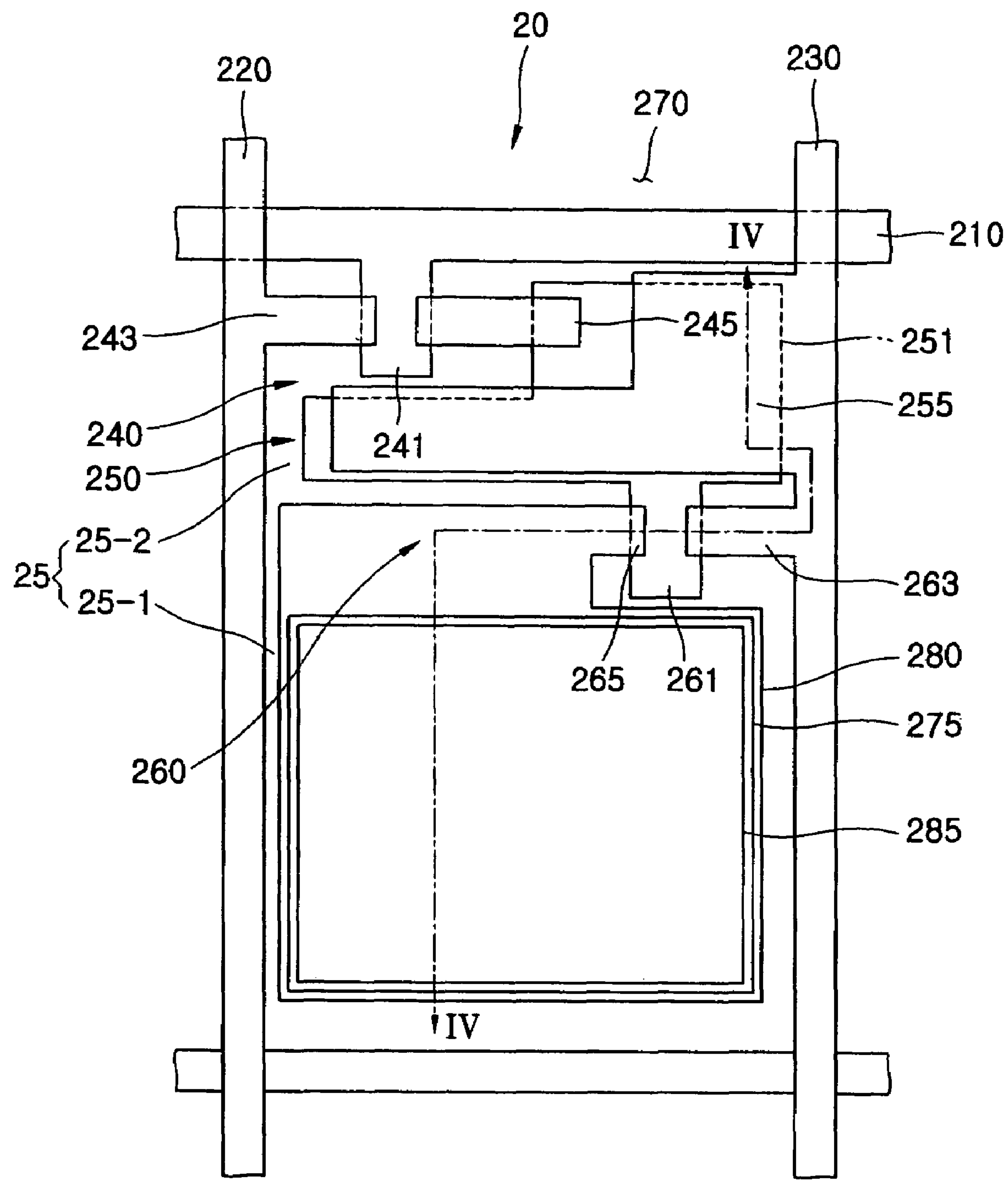
FIG. 3 is a plan view of a pixel of an organic electroluminescent display device including an OTFT according to an embodiment of the present invention.

FIG. 3 is a plan view of a pixel of a flexible organic electroluminescent display device 20 including organic thin film transistors (OTFT) according to an embodiment of the present invention. Although the flexible organic electroluminescent display device has a plurality of pixels arranged in a matrix, FIG. 3 illustrates a plan view of only one pixel for convenience.

Referring to FIG. 3, the flexible organic electroluminescent display device 20 includes a gate line 210, a data line 220, and a power line 230. A pixel region 25 is defined by the gate line 210, the data line 220, and the power line 230. A pixel is disposed in the pixel region 25. The pixel region 25 includes an emission region 25-1 and a non-emission region 25-2. As discussed above, in the emission region 25-1, light is emitted from an organic emission element of the display device. In the non-emission region 25-2, light is not emitted.

The pixel disposed in the pixel region 25 includes a switching OTFT 240, a driving OTFT 260, a capacitor 250, and the organic emission element including a lower electrode 280 used as a pixel electrode (anode electrode). The organic emission element included in a pixel is disposed in the emission region 25-1 of the pixel region 25. The switching OFTF 240, the driving OTFT 260, and the capacitor 250 are disposed in the non-emission region 25-2 of the pixel region 25.

The switching OTFT 240 disposed in the non-emission region 25-2 of the pixel region 25 includes a gate electrode 241 connected to the gate line 210, a semiconductor layer 270, and source and drain electrodes 243 and 245. The capacitor 250 disposed in the non-emission region 25-2 of the pixel region 25 includes a lower electrode 251 connected to the drain electrode 245 of the switching OTFT 240, and an upper electrode 255 that overlaps the lower electrode 251 and is connected to the power line 230.

The driving OTFT 260 disposed in the non-emission region 25-2 of the pixel region 25 includes a gate electrode 261 connected to the lower electrode 251 of the capacitor 250, the semiconductor substrate 270, a source electrode 263 connected to the power line 230, and a drain electrode 265.

In the organic electroluminescent display device according to one embodiment, which has a rear emission type structure, one of the source electrode 263 and drain electrode 265 of the driving OTFT 260, for example, the drain electrode 265, extends to the emission region 25-1 of the pixel region 25. Accordingly, a portion of the drain electrode 265 that is formed in the non-emission region 25-2 and overlaps the gate electrode 261 acts as an electrode of the driving OTFT 260, and a portion of the drain electrode 265 formed in the emission region 25-1 acts as a lower electrode 280, which is a pixel electrode, of the organic emission element.

In one embodiment, an electrode material used to form the source electrode 263 of the driving OTFT 260 affects a contact resistance between the source electrode 263 and the semiconductor layer 270. In one embodiment, the electrode material advantageously has a higher work function than the semiconductor layer 270. In one embodiment, the source electrode 263 is formed of a higher work function electrode material than the semiconductor layer 270. Therefore, the source electrode 263 may be formed of a metal electrode material or a conducing organic material. Examples of the metal electrode material include, but not limited to, Au, Pt, Pd, and MoW oxide. In one embodiment, the conducting organic material includes PEDOT.

In one embodiment, an electrode material used to form the drain electrode 265 does not affect a contact resistance between the drain electrode 265 and the semiconductor layer 270. In one embodiment, the drain electrode 265 may be formed of a transparent material such that the drain electrode 265 can act as a pixel electrode as well as a drain electrode. In one embodiment, the drain electrode 265 may be formed of a transparent conducting material, such as ITO or IZO.

Figure 4:
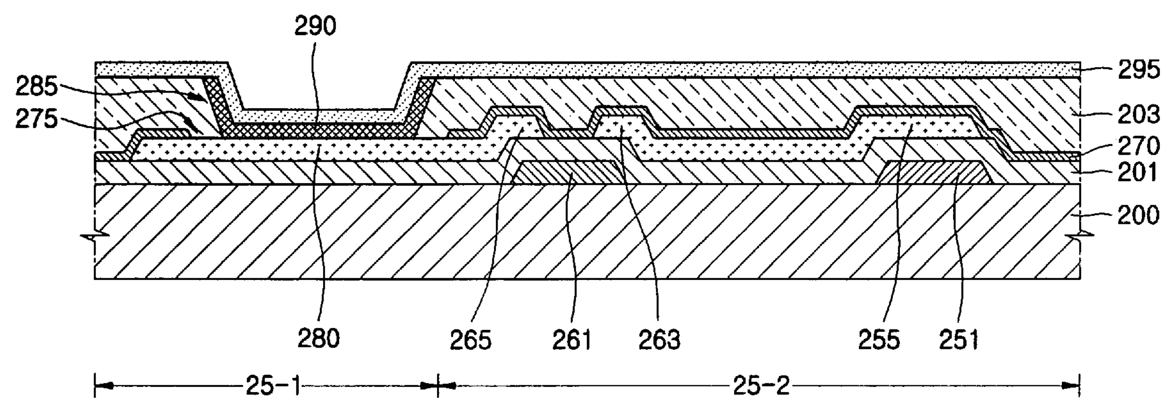
FIG. 4 is a sectional view taken along line IV-IV in FIG. 3.

FIG. 4 is a sectional view taken along line IV-IV in FIG. 3. FIG. 4 illustrates only the organic emission element, the driving OTFT 260 used to drive the organic emission element, and a capacitor of a pixel.

Referring to FIG. 4, the flexible organic electroluminescent display including the OTFTs according to an embodiment of the present invention includes a flexible substrate 200. In one embodiment, the flexible substrate 200 may include a polymer plastic film having excellent heat-resistance such that the flexible substrate 200 can withstand a temperature required to manufacture the organic electroluminescent display device.

In one embodiment, the polymer plastic film may be polyethersulphone (PES), polyacrylate (PAR), polyetherimide (PEI), polyethyelenen napthalate (PEN), polyethyeleneterepthalate (PET), or the like.

The gate electrode 261 and the lower electrode 251 of the capacitor 250, which is separated from the gate electrode 261, are formed on the substrate 200. In one embodiment, the gate electrode 261 and the lower electrode 251 of the capacitor 250 may be formed of identical materials or different materials.

A first insulator 201 is formed on the substrate 200. In one embodiment, a portion of the first insulator 201 formed on the gate electrode 261 acts as a gate insulator of the OTFT, and a portion of the first insulator 201 interposed between the lower electrode 251 and the upper electrode 255 acts as a dielectric layer of the capacitor 250. In one embodiment, the first insulator 201 may be formed of benzocyclobutene (BCB), polyvinylphenol (PVP), polyimide, or parylene.

The source electrode 263 and the drain electrode 265, respectively, overlapping side portions of the gate electrode 261, and the upper electrode 255 of the capacitor 250 connected to the source electrode 263 are formed on the first insulator 201.

In one embodiment, the source electrode 263 and the drain electrode 265 are formed of different materials. An electrode material used to form the source electrode 263 affects a contact resistance between the source electrode 263 and the semiconductor layer 270. In one embodiment, the source electrode 263 is formed of a higher work function electrode material than the semiconductor layer 270. In one embodiment, the electrode material may be a metal electrode material or a conducting organic material. In one embodiment, the metal electrode material may be Au, Pt, Pd, or MoW oxide. In one embodiment, the conducting organic material may be PEDOT, or the like. In one embodiment, the upper electrode 255 of the capacitor 250 and the source electrode 263 may be formed of identical materials or different materials.

In one embodiment, the drain electrode 265 acts both as a drain electrode of the driving OTFT 260 and as the lower electrode 280, which is an anode electrode, of the organic electroluminescent emission device. In one embodiment, the drain electrode 265 is formed of a transparent conducting material, such as ITO and IZO. A portion of the drain electrode 265 overlapping the gate electrode 261 in the non-emission region 25-2 of the pixel region 25 acts as a drain electrode of the driving OTFT 260. A portion of the drain electrode 265 disposed in the emission region 25-1 acts as a pixel electrode.

The semiconductor layer 270 is formed over the substrate 200. The semiconductor layer 270 has an opening 275 exposing a portion of the lower electrode 280, which is a pixel electrode, formed in the emission region 25-1 of the pixel region 25. That is, the opening 275 of the semiconductor layer 270 defines the lower electrode 280, which is a portion of the drain electrode 265. The opening 275 is exposed by an opening 285 in a later processing step.

The semiconductor layer 270 contacting the source and drain electrodes 263 and 265 is formed over the first insulator 201. In one embodiment, the source electrode 263 is formed of a higher work function electrode material than the semiconductor layer 270 such that the contact resistance between the source electrode 263 and the semiconductor layer 270 is low.

In one embodiment, the semiconductor layer 270 may be formed of pentacene, tetracene, anthracene, naphthalene, α-6-thiophene, perylene or a derivative thereof, rubrene or a derivative thereof, coronene or a derivative thereof, perylene tetracarboxylic diimide or a derivative thereof, perylene tetracarboxylic dianhydride or a derivative thereof, polythiophene or a derivative thereof, polyparaperylene vinylene or a derivative thereof, polyfluorene or a derivative thereof, polythiophenevinylene or a derivative thereof.

A second insulator 203 is formed over the semiconductor layer 200. The second insulator 203 has the opening 285 exposing a portion of the lower electrode 280. The second insulator 203 acts as a protecting layer. In one embodiment, the second insulator 203 is formed of benzocyclobutene (BCB), an organic compound containing an acryl group, fluoropolyarrylether (FPAE), cytop, or perfluorocyclobutane (PFCB).

An organic layer 290 is formed on the lower electrode 280 exposed by the opening 285 of the second insulator 203. Then, a cathode electrode 295, which is an upper electrode, is formed over the substrate 200. In one embodiment, the organic layer 290 includes at least an organic layer selected from a hole injection layer, a hole transport layer, an organic emission layer, an electron transport layer, an electron injection layer, and a hole barrier layer.

In one embodiment, the lower electrode 280 is a portion of the drain electrode 265 extended to the emission region 25-1 of the pixel region 25. Thus, an additional masking process for forming the lower electrode 280 is not required. In addition, the manufacturing process for forming a pixel isolation layer and a masking process for forming the opening in the pixel isolation layer can also be omitted since the drain electrode 265 and the lower electrode 280 are formed on the first insulator 201 and the lower electrode 280 is exposed by the opening 285 of the second insulator 203.

The driving OTFT of the organic electroluminescent display device according to one embodiment can be used as a switching device of a flat display device, such as a liquid crystal display device.

In another embodiment, the source electrode can extend to the emission region 25-1 so as to form the pixel electrode. In one embodiment, when the source electrode is used as the pixel electrode, the drain electrode is formed of a higher work function metal electrode material than a semiconductor layer.

Further, although the OTFT of the organic electroluminescent display device according to one embodiment has a bottom contact structure, the OTFT can have a top contact structure or a top gate structure. That is, an OTFT having a top contact structure or a top gate structure can have a simple manufacturing process by forming the pixel electrode which is an extension of the drain electrode (or source electrode) to the emission region 25-1. Furthermore, a low contact resistance between the source electrode and the semiconductor layer can be obtained by using a source electrode formed of a high work function electrode material. In one embodiment, the OTFT can be used to form a rear emission type organic electroluminescent display device or a front emission type organic electroluminescent display device.

In one embodiment, a pixel disposed in a pixel region includes a driving OFTF, a switching OTFT, a capacitor, and an organic emission element. In another embodiment, the pixel can have a different configuration.

According to an embodiment of the present invention, a source electrode or a drain electrode of an OTFT is formed of a pixel electrode material such that a masking process for forming a lower electrode can be omitted. In addition, a process for forming a pixel isolation layer and a masking process for forming an opening in the pixel isolation layer can also be omitted. Due to these omissions, the manufacturing process can be simplified.

In one embodiment, the source electrode is formed of a higher work function electrode material than a semiconductor layer such that a contact resistance between the source electrode and the semiconductor layer can be maintained at a low level.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A thin film transistor for a flat display device, comprising:

a substrate;

a gate electrode formed on the substrate;

a source electrode overlapping a first side portion of the gate electrode;

a drain electrode overlapping a second side portion of the gate electrode;

a gate insulator formed between i) the source and drain electrodes and ii) the gate electrode; and a semiconductor layer that contacts the source and drain electrodes, wherein one of the source or drain electrodes is formed of a transparent material and the other of the source and drain electrodes is formed of a material with a higher work function than the semiconductor layer, wherein the transparent source or drain electrode comprises a pixel electrode of an organic light emitting diode, wherein the pixel electrode is formed in the same layer as the transparent source or drain electrode, and wherein the semiconductor layer has an opening, and an insulator and a layer of the organic light emitting diode extend into the opening and cover a portion of the pixel electrode.

2. The thin film transistor of claim 1, wherein the gate insulator is formed of an organic insulating material and the semiconductor layer is formed of an organic semiconducting material.

3. The thin film transistor of claim 1, wherein the other electrode material is a metal material selected from the group consisting of Au, Pt, Pd, and MoW oxide, or an organic conducting material selected from PEDOT.

4. The thin film transistor of claim 1, wherein the transparent electrode material is formed of ITO or IZO.

5. A flat display device, comprising:

a substrate comprising an emission region and a non-emission region;

a first electrode formed on the substrate;

a second electrode, overlapping a first side portion of the first electrode, formed in the non-emission region;

a third electrode, overlapping a second side portion of the first electrode, formed in the non-emission region;

an insulator formed between i) the second and third electrodes and ii) the first electrode; and a semiconductor layer formed over the substrate, wherein one of the second electrode and the third electrode extends to the emission region, a portion of the extending electrode is configured to function as a pixel electrode of an organic light emitting diode, and the pixel electrode is formed in the same layer as the extending electrode, and wherein the semiconductor layer has an opening, and an insulator and a layer of the organic light emitting diode extend into the opening and cover a portion of the pixel electrode.

6. The flat display device of claim 5, wherein the second electrode and the third electrode are formed of different materials.

7. The flat display device of claim 5, wherein the semiconductor layer comprises an organic semiconductor layer, and the extending electrode is a drain electrode, and the other electrode is a source electrode formed of a material with a higher work function than the organic semiconductor layer.

8. The flat display device of claim 5, wherein the extending electrode is a drain electrode formed of a transparent material.

9. The flat display device of claim 5, wherein the extending electrode is formed of a transparent conducting material selected from ITO and IZO.

10. The flat display device of claim 5, wherein the other electrode is formed of i) a material with a higher work function than the semiconductor layer, or ii) an organic conducting material selected from PEDOT.

11. The flat display device of claim 5, wherein the insulator comprises an organic insulator which acts as a gate insulator.

12. The flat display device of claim 7, wherein the source electrode is formed of a metal material selected from the group consisting of Au, Pt, Pd, and MoW oxide, or of an organic conducting material selected from the group consisting of PEODT.

13. The flat display device of claim 8, wherein the transparent material is ITO or IZO.

14. A flat display device, comprising:

a substrate;

a gate line, a data line, and a power line arranged on the substrate;

a pixel region which has a non-emission region and an emission region, and includes the gate line, the data line, and the power line;

an organic thin film transistor which comprises i) a gate electrode, ii) source and drain electrodes, and iii) a semiconductor layer, and is disposed in the non-emission region; and an organic light emitting diode comprising a pixel electrode arranged in the emission region, wherein the source and drain electrodes are formed of different materials, wherein one of the source electrode and the drain electrode extends to the emission region of the pixel region, wherein at least a portion of the extending electrode is configured to function as the pixel electrode of the organic light emitting diode, wherein the pixel electrode of the organic light emitting diode and the extending electrode are formed in the same layer, and wherein the semiconductor layer has an opening, and an insulator and a layer of the organic light emitting diode extend into the opening and cover a portion of the pixel electrode.

15. The flat display device of claim 14, wherein the semiconductor layer comprises an organic semiconductor layer, the other electrode is a source electrode formed of a material with a higher work function than the organic semiconductor layer, and the source electrode material is a metal material selected from the group consisting of Au, Pt, Pd, and MoW oxide or an organic conducting material selected from PEDOT.

16. The flat display device of claim 14, wherein the semiconductor layer is an organic semiconductor layer, and the extending electrode is a drain electrode formed of a transparent material selected from ITO and IZO.

17. An organic electroluminescent display device, comprising:

a substrate comprising an emission region and a non-emission region;

an organic thin film transistor, which comprises i) a gate electrode, ii) source and drain electrodes, respectively, overlapping both side portions of the gate electrode, and iii) a semiconductor layer, and is disposed in the non-emission region; and an organic light emitting diode comprising a lower electrode, an organic layer, and an upper electrode, wherein one of the source electrode and drain electrode of the organic thin film transistor extends to the emission region, a portion of the extending electrode is configured to function as a lower electrode of the organic light emitting diode, and the lower electrode of the organic light emitting diode and the extending electrode are formed in the same layer, and wherein the semiconductor layer has an opening, and an insulator and a layer of the organic light emitting diode extend into the opening and cover a portion of the lower electrode.

18. The organic electroluminescent display device of claim 17, wherein the semiconductor layer is an organic semiconductor layer, and the source electrode and the drain electrode are formed of different materials.

19. The organic electroluminescent display device of claim 17, wherein the source electrode is formed of a material with a higher work function than the semiconductor layer, and the source electrode material is a metal material selected from the group consisting of Au, Pt, Pd, and MoW oxide or an organic conducting material selected from PEDOT.

20. The organic electroluminescent display device of claim 18, wherein the drain electrode is formed of a transparent conducting material selected from ITO and OZO.

21. An organic electroluminescent display device, comprising:

a substrate comprising an emission region and a non-emission region;

a gate electrode formed in the non-emission region of the substrate;

a first insulator formed over the substrate;

a source electrode overlapping a first side portion of the gate electrode and formed on the first insulator in the non-emission region;

a drain electrode overlapping a second side portion of the gate electrode and formed on the first insulator in the non-emission region, a portion of the drain electrode extending to the emission region to form a lower electrode, wherein the drain electrode and the lower electrode are formed in the same layer;

an organic semiconductor layer formed on the first insulator to contact the source and drain electrodes, wherein the semiconductor layer has an opening that exposes a portion of the lower electrode;

a second insulator, formed extending into the opening of the organic semiconductor layer and partly covering the exposed portion of the lower electrode;

an organic layer formed extending into the opening and on the portion of the lower electrode not covered by the second insulator; and an upper electrode, formed over the substrate, covering the organic layer.

22. The organic electroluminescent display device of claim 21, wherein the source electrode is formed of a metal material selected from the group consisting of Au, Pt, Pd, and MoW oxide.

23. The organic electroluminescent display device of claim 21, wherein the drain electrode is formed of ITO or IZO.

24. The organic electroluminescent display device of claim 21, wherein the first insulator is an organic insulator which acts as a gate insulator, and the second insulator is an organic insulator which acts as a protecting layer.

* * * * *